United States Patent [19]

Kano et al.

[11] Patent Number: 5,618,397
[45] Date of Patent: *Apr. 8, 1997

[54] SILICIDE TARGETS FOR SPUTTERING

[75] Inventors: Osamu Kano; Yasuhiro Yamakoshi; Junichi Anan; Koichi Yasui, all of Kitaibaraki, Japan

[73] Assignee: Japan Energy Corporation, Tokyo, Japan

[*] Notice: The term of this patent shall not extend beyond the expiration date of Pat. No. 5,464,520.

[21] Appl. No.: 423,233

[22] Filed: Apr. 17, 1995

Related U.S. Application Data

[62] Division of Ser. No. 224,445, Apr. 7, 1994, Pat. No. 5,460,793.

[30] Foreign Application Priority Data

May 7, 1993 [JP] Japan .................... 5-130113

[51] Int. Cl.⁶ .................... C23C 14/34; C22C 29/00; C22C 32/00
[52] U.S. Cl. .................... 204/298.13; 75/245; 419/10; 419/23; 419/26; 419/38; 204/298.12; 428/546
[58] Field of Search .................... 204/298.12, 298.13; 428/446, 552, 546, 548, 551; 501/154, 96; 423/344; 419/10, 23, 26, 28, 38, 66; 75/245, 730

[56] References Cited

U.S. PATENT DOCUMENTS

| | | | |
|---|---|---|---|
| 875,675 | 12/1907 | Potter | 423/344 |
| 4,619,697 | 10/1986 | Hijikata et al. | 419/10 |
| 4,663,120 | 5/1987 | Parent et al. | 419/10 |
| 4,938,798 | 7/1990 | Chiba et al. | 204/298.13 |
| 5,234,643 | 8/1993 | Matsumoto | 264/65 |
| 5,240,658 | 8/1993 | Lukacs, III et al. | 264/63 |
| 5,294,321 | 3/1994 | Satou et al. | 204/298.13 |
| 5,409,517 | 4/1995 | Satou et al. | 75/245 |
| 5,415,829 | 5/1995 | Ohhashi et al. | 419/23 |
| 5,418,071 | 5/1995 | Satou et al. | 75/245 |
| 5,447,616 | 9/1995 | Satou et al. | 204/298.13 |
| 5,464,520 | 11/1995 | Kano et al. | 204/298.13 |

FOREIGN PATENT DOCUMENTS

| | | | |
|---|---|---|---|
| 3807579 | 9/1988 | Germany | 423/344 |
| 62-143811 | 6/1987 | Japan | 423/344 |
| 63-182211 | 7/1988 | Japan | 423/344 |
| 63-238265 | 10/1988 | Japan . | |
| 1-136969 | 5/1989 | Japan . | |
| 1-208462 | 8/1989 | Japan | 204/208.12 |
| 1-249619 | 10/1989 | Japan . | |
| 2-247379 | 10/1990 | Japan . | |
| 5-1370 | 1/1993 | Japan . | |

*Primary Examiner*—R. Bruce Breneman
*Assistant Examiner*—Rodney G. McDonald
*Attorney, Agent, or Firm*—Seidel, Gonda, Lavorgna & Monaco, PC

[57] ABSTRACT

Metal silicide targets are provided for sputtering which have a density of at least 99%, no more than one coarse silicon phase 10 μm or larger in size that appears, per square millimeter, on the sputter surface, and an oxygen content of at most 150 ppm. They are made by a method which comprises finely grinding a synthesized silicide powder, vacuum annealing the finely ground powder in a hot press die without the application of pressure, and thereafter compacting and sintering the compact to a density of at least 99% by hot pressing. Alternatively, the finely ground powder is vacuum annealed as a presintered body at a density ratio of 50 to 75%, and thereafter is compacted and sintered.

3 Claims, No Drawings

5,618,397

SILICIDE TARGETS FOR SPUTTERING

This is a divisional of Ser. No. 08/224,445 filed on Apr. 7, 1994 now U.S. Pat. No. 5,460,793

BACKGROUND OF THE INVENTION

This invention relates to metal silicide targets for sputtering and a method of manufacturing the same whereby the formation of particulate matters, or particles, can be substantially decreased from the prior art level and an increase in the oxygen content due to fine grinding of the powder material is avoided. The metal silicide films formed by sputtering process from the metal silicide targets of the invention are useful for the films of large-scale integrated circuits that involve very fine wiring and interconnecting line widths and spaces. They promise use in present and future semiconductor devices such as high integration-scale (e.g., 4, 16, and 64-megabit) LSIs and VLSIs.

Polysilicon has hitherto been used in electrodes or wiring or interconnecting lines of LSI semiconductor devices. The tendency toward greater complexity of LSI semiconductor devices has caused it to present the problem of delay in signal transmission rate due to its resistance. Meanwhile, there is a demand for higher-melting-point materials to be used as electrodes to facilitate the formation of lines by self-alignment technique. Under these circumstances, wiring and electrodes of metal silicides that possess lower electric resistivity than polysilicon and are compatible with the silicon gate process have come into use. Examples of the metal silicides are as follows: tungsten silicides ($WSi_x$), molybdenum silicides ($MoSi_x$), tantalum silicides ($TaSi_x$), titanium silicides ($TiSi_x$), cobalt silicides ($CoSi_x$), chromium silicides ($CrSi_x$), nickel silicides ($NiSi_x$), and silicides of platinum metals, etc. A film of such a metal silicide is formed by sputtering of a metal silicide target. The metal silicide target used often has a silicon/metal molar ratio greatly in excess of 2, because a molar ratio x of less than 2 imposes so much stresses on the resulting film that the film tends to come off.

Metal silicide targets are manufactured by mixing silicon powder and metal powder in a silicon/metal molar ratio of 2 or more, forming the mixture into a synthesized silicide powder, compressing and sintering the powder to obtain compacts, and then machining the sintered compacts to a desired shape.

The recent trend toward greater scale of integration of LSI semiconductor devices (e.g., to 4, 16, and 64-megabits) has reduced their wiring line widths to submicron levels. With this tendency, "particles" originating from the target are attracting attention as a subject of growing concern. The term "particles" as used herein means the particulate matter that is scattered and flies off from a target on sputtering of the target. The particles deposit directly on the film on a substrate or stick and build up on surrounding walls and parts and then come off to deposit on the film, inviting severe troubles such as breaking and shorting of lines. The particle problem is becoming more and more serious with the progress of integration and refinement of the circuits of electronic devices. Thus it is noted anew that conventional silicide targets are unsuitable for VLSI applications because they emit too many particles during sputtering.

It has already been recognized in the art that the presence of coarse aggregates of free silicon phases contribute largely to the release of particles from metallic silicide targets. On the basis of this recognition, e.g., Japanese Patent Application Public Disclosure No. 191366/1992 discloses a metal silicide target of a refractory metal and Si characterized in that the average diameter of free Si particles is 30 μm or less and the number of free Si particles having diameters of 40 μm or more that appear on the surface and cross section of the target is 50 or less per square millimeter, and also a method of manufacturing the target. Patent Application Public Disclosure No. 1370/1993 previously filed by the present applicant imposes an additional restriction, introducing a metal silicide target characterized in that the number of coarse silicon phases 10 μm or larger in size that are found present in the sputter surface of the target is 10 or fewer per square millimeter. Also No. 1370/1993 provides after a method of manufacturing such targets.

For the manufacture of metal silicide targets with fewer coarse silicon phases, finer raw material silicon and metal powders are used. Here arises another problem; the finer the powders the higher the oxygen content. Oxygen-rich silicide targets give off oxygen on sputtering, which is detrimental to the properties, such as resistivity, of the resulting film.

OBJECT OF THE INVENTION

The object of the present invention is to establish a technology for the manufacture of metal silicide targets for sputtering that give off a minimum of particles and have low oxygen contents.

SUMMARY OF THE INVENTION

As finer raw material powders are used to reduce particle generation, the amount of the surface oxide formed on the product increases. We have tackled the basically contradictory problems of suppressing particle generation and reducing oxygen content. A metal silicide target that satisfies both requirements has now been successfully obtained by using a finely ground metal silicide powder and vacuum annealing the fine silicide powder directly or as a presintered body prior to final hot pressing. On the basis of the above findings, the present invention provides:

(1) a metal silicide target for sputtering which has a density of at least 99%, no more than one coarse silicon phase 10 μm or larger in size that appears, per square millimeter, on the sputter surface of the target, and an oxygen content of at most 150 ppm, (2) a method of manufacturing a metal silicide target for sputtering which has a density of at least 99%, has no more than one coarse silicon phase 10 μm or larger in size that appears, per square millimeter, on the sputter surface of the target and has an oxygen content Of at most 150 ppm, which comprises preparing a synthesized metal silicide powder, further finely grinding the synthesized metal silicide powder, vacuum annealing the further finely ground metal silicide powder in a hot press die without the application of pressure, and thereafter compacting and sintering the annealed powder to a density of at least 99% by a hot press, and (3) a method of manufacturing a metal silicide target for sputtering which has a density of at least 99%, has no more than one coarse silicon phase 10 μm or larger in size that appears, per square millimeter, on the sputter surface of the target and has an oxygen content of at most 150 ppm, which comprises preparing a synthesized metal silicide powder, further finely grinding the synthesized metal silicide powder, preparing a presintered body at a density ratio of 50 to 75% of the further ground metal silicide powder, vacuum annealing the presintered body, and thereafter compacting and sintering the annealed presintered body to a density of at least 99% by a hot press.

The above mentioned method may further include controlling the area ratio of silicon phases that appear on the sputter surface to 23% or less, and at least partly removing the deformed layer on the target surface to attain a surface roughness ranging from more than 0.05 μm to 1 μm.

There has been no literature as to any attempt at concurrently solving the particle problem and the oxygen content problem. Patent Application Public Disclosure No. 70270/1987 introduces a process of hot pressing a silicide powder to manufacture a high-density silicide target. It does not refer to the amount of coarse silicon phases that appear on the sputter surface, in recognition of the particle problem. Patent Application Public Disclosure Nos. 58866/1986, 136964/1986, and 58865/1986 teach the manufacture of silicide targets with an oxygen content of 7 to 19 ppm by either heating a presintered mass of silicide with a density of 48 to 95% above the melting temperature of Si or impregnating the mass with molten Si. These references are all silent on the particle problem. In the present invention, avoiding the emergence of a molten phase is essential for the prevention for particle generation as well as of Si phase growth.

DETAILED DESCRIPTION OF THE INVENTION

In accordance with the invention, a fine enough metal silicide powder is used for the manufacture of a metal silicide target so as to limit the number of coarse silicon phases 10 μm or larger in size that appears on the target sputter surface to no more than one particle per square millimeter to and attain a target density of at least 99% so as to reduce the voids. Moreover, prior to the final step of hot pressing, the fine metal silicide powder is vacuum annealed directly or as a presintered body. In this way both the decrease in the number of particles formed and the reduction of the oxygen content are simultaneously accomplished.

In addition, desirably, the area ratio of silicon phases that appear on the sputter surface is restricted to 23% or less, whereby overall control of the probability of free silicon generation is effected. The deformed layer on the target surface is partly removed to attain a surface roughness ranging from more than 0.05 μm to 1 μm. These restrictions substantially reduce the amount of the early-stage particles that come out mostly at the early stage of sputtering, thereby sharply decreasing the amount of particle generation. Thus the reduction of both early-stage particle generation and particle generation at the stabilized stage is realized. If there are particles resulting from early-stage particle generation, they deposit largely on the target surface with the possibility of coming off during the stable period. The reduction of early-stage particle generation lessens the possibility of secondary particle generation.

The raw material metal silicide powder is prepared, e.g., by the method disclosed in Patent Application Public Disclosure No. 70270/1987 which consists of mixing metal and silicon powders, synthesizing, grinding, and sieving. It is advisable to make the particle size of the synthesized metal silicide powder uniform by dry sieving it beforehand, preferably to 50 mesh or finer, more preferably to 200 mesh or finer.

Desirably, the metal and silicon raw material powders are mixed by a V-type mixer or the like in as low a Si/metal molar ratio as possible lower than commonly used ratios, so that the area ratio of silicon phases that ultimately appear on the sputter surface of the target is 23% or less, within the limits of performance allowance of the metal silicide thin film that is eventually formed. For example, the following molar ratios are recommended:

| | |
|---|---|
| Si/W molar ratio = 2.25 | Si/Mo molar ratio = 2.15 |
| Si/Ti molar ratio = 2.23 | Si/Ta molar ratio = 2.20 |
| Si/Cr molar ratio = 2.20 | Si/Co molar ratio = 2.20 |
| Si/Ni molar ratio = 2.20 | Si/Pt molar ratio = 1.20 |

It is usual to set the amount of silicon in a slight excess for compensating the volatilization loss in the subsequent synthesis step. The amount silicon lost by volatilization can be precisely grasped from the equipment and conditions to be used for the operation. Desirably, a minimum excess amount of silicon should be used. The powder mixture is subjected to synthesis treatment in a high-temperature vacuum furnace. The synthesis reaction is exothermic. The conditions for silicide synthesis are as follows:

| | |
|---|---|
| Degree of vacuum: | $10^{-3} \sim 10^{-5}$ Torr |
| Temperature: | 800 ~ 1300° C. (varies with metals) |
| Time: | sufficient time for the synthesis reaction $M + xSi \rightarrow MSi_x$ ($x = 2.00 \sim 2.33$, but for platinum group metals $x = 1.00 \sim 1.26$) |

The silicide thus synthesized is cooled under vacuum, cooled down to 50° C. or below, and taken out of the furnace and ground. Care must be taken to avoid an increase in the $O_2$ content during grinding by a ball mill or the like, e.g., by performing the grinding in an Ar-replaced atmosphere. To prevent the contamination with Fe or other impurities, it is desirable that the balling mill use balls coated with or made of the same metal as that which is handled.

As for the raw material metal powder for the preparation of a metal silicide, a metal powder pulverized or finely crushed by a grinding equipment, e.g., a ball mill is used. The maximum particle diameter of the metal powder to be used, in terms of the aggregated secondary particles, is, e.g., 60 μm or less, preferably 20 μm or less. Examples of useful metals are tungsten, molybdenum, titanium, tantalum, chromium, cobalt, nickel, and platinum group metals.

The raw material silicon powder is prepared by grinding a starting material, such as polysilicon chips for semiconductor use, e.g., in a ball mill in an argon atmosphere for 12 to 28 hours.

The metal and silicon powders to be used desirably as starting materials contain radioactive elements, alkali metals, transition metals, heavy metals, oxygen, or/and other substances, all reduced in amounts to minimal traces. Raw material silicon powders ranging in purity from 5 to 9N (99.999~99.9999999 wt %) or even higher are readily available on the market. With raw material metal powders too, the present applicant has already established a technology of reducing the contents, such as of radioactive elements, alkali metals, transition elements, and heavy metals, in tungsten, molybdenum, cobalt, tantalum, and many other metals to just traces by a combination of chemical refining (recrystallization) and physical refining (arc melting).

Where an adjustment of the molar ratio is required, a metal silicide powder which is free from coarse silicon particles and has a molar ratio different from that of the original metal silicide being produced is added according to the need. The metal silicide powder to be added is fine enough to pass through a 50-mesh sieve, preferably a 200-mesh sieve. The original silicide powder and the additional silicide powder are thoroughly mixed using, e.g., a V-type mixer. The adjustment of composition with the use of a silicide powder, rather than silicon powder, before hot pressing, helps prevent particle generation owing to silicon aggregation. The free silicon particles entrapped in the silicon aggregate are partly responsible for the particle generation. Thus the addition of silicide powder rather than silicon powder which is easily aggregatable for the compositional adjustment prior to hot pressing inhibits the generation of particles.

Under the invention the metal silicide powder is secondarily pulverized by a fine grinding mill and coarse particles 20 μm or larger in size are eliminated. Fine grinding mills available commercially may be used which protect the metal silicide powder charge from contamination. Examples of proprietary equipment are as follows:

(a) "Superfine Grinding Å ng-Mill" (manufactured by Hosokawa Micron Co., Ltd.)

(b) "Supersonic Jet Grinder Models I and PJM" (by Nippon Pneumatic Industry Co., Ltd.)

(c) "Current Jet" (by Nisshin Engineering Co., Ltd.)

(d) "Single Track Jet Mill" (by Seishin Kigyo Co., Ltd.)

(e) "New Superfine Grinding Mill" (by Kawasaki Heavy Industries Ltd.)

(f) "Counter-Jet Mill" (by Itomah Engineering Co., Ltd.)

(g) "CF Mill" (by Ube Industries, Ltd.)

By the secondary pulverization, the percentage of coarse particles 10 μm or larger in size, especially particles larger than 8 μm, can be reduced to almost zero.

The fine metal silicide powder so obtained has an oxygen content of more than 1000 ppm, usually between 1000 and 2000 ppm. Using this fine metal silicide powder and by adopting (1) direct hot pressing or (2) indirect hot pressing, deoxygenation and densification are effected for manufacture of a metal silicide composition having at least one target surface suitable for sputtering.

In direct hot pressing, the fine metal silicide powder is directly filled in a hot press die. Ordinarily, hot pressing is conducted while adequately compacting the powder from a temperature elevation procedure, but under the invention, by contrast, the powder is not compacted at all while the temperature is raised in a state where adequate evacuation is feasible. After the arrival at a predetermined temperature, compaction does not immediately follow. The evacuation and heating are maintained for an additional period of 1 to 10 hours, and then ordinary hot pressing is initiated. In conventional hot pressing practice, the powder is compacted before the temperature is allowed to rise, an unsatisfactory deoxygenation effect is achieved. In the case of a molybdenum silicide, for example, a silicide powder containing 1200 ppm of oxygen will yield a target with an oxygen content decreased at most to 1000 ppm. When the molybdenum silicide is heated without prior compaction but in a state capable of being thoroughly evacuated, and is held in the heated condition, the original oxygen content of 1200 ppm drops to only 60 to 100 ppm in 4 hours and down even to 40 ppm in 10 hours. With a tungsten silicide, for example, the oxygen content is lowered from 1400 ppm in the material silicide to only 30 ppm in the product obtained after 10 hours of holding.

The holding time varies with the quantity of silicide to be hot pressed, but it usually begins to produce a deoxygenation effect in an hour, and 10 hours of holding is enough to meet the current deoxygenation requirement. Longer holding for more than 10 hours is rather deleterious because of productivity drop, contamination with carbon from the die, and other adverse effects upon the holding. The mechanism of deoxygenation is presumably explained by the reaction $Si+O \rightarrow SiO(g)$ or $SiO_2+Si \rightarrow 2SiO$ (g). Hot pressing causes a slight change in the Si content, and it decreases the original Si/metal molar ratio by 0.02 to 0.05.

In indirect hot pressing, a fine silicide powder is first formed into a briquet with a density of 50 to 75%. For the briquetting, a method using a cold press, cold isostatic pressing (CIP), low-temperature, low-pressure hot press or the like is employed. The briquet is heated to 1000° to 1380° C. while being evacuated to a high degree of vacuum and is held in that state for 1 to 10 hours. Once cooled, the briquet is packed in a hot press die and hot pressed in the usual manner to yield a silicide target. In the briquet the oxygen content is on the same level as in the silicide powder. The briquet density is specified to range from 50 to 75% for the following reasons. A density below 50% makes the briquet difficult to handle, although it favors deoxygenation. The briquet must be strong to some degree, just enough for handling. A density above 75% eliminates thoroughly opened pores, making evacuation throughout difficult or impossible, which in turn leads to inadequate deoxygenation. If the heating temperature is below 1000° C., the deoxygenation effect is limited, while a temperature above 1380° C. is effective for oxygen removal but is prone to induce the grain growth of the Si phase. It is imperative to prevent the emergence of a liquid Si phase for the preclusion of unwanted particle generation. The holding time ranges from 1 to 10 hours depending on the temperature used, because a holding time that is too short results in insufficient deoxygenation, and prolonged holding reduces the productivity. For the other aspects of the indirect hot pressing operation, reference is made to the above description of direct hot pressing.

Ordinary hot pressing is then carried out. It is important that this step be so implemented as to compact the silicide powder to an adequately high density in a density ratio of at least 99%, preferably at least 99.99%. Application of a preload to the compact at the time of hot pressing, and holding the state for some time after the pressing, is a recommended practice. The conditions for hot pressing are as follows:

| | |
|---|---|
| Degree of vacuum: | $10^{-5} \sim 10^{-6}$ Torr |
| Temperature: | 900 ~ 1380° C. (depending on the metal) |
| Press pressure: | 250 ~ 600 kg/cm$^2$ |
| Time: | 30 min. ~ 3 hr. |
| Holding time: | the longer the better, the minimum period being 30 min. |

For the hot pressing the metal silicide powder is placed into a compaction mold and the temperature increased. When a target temperature between 900° C. and 1380° C. has been reached, the application of a predetermined press pressure is initiated while the above temperature level is being maintained. The application of the pressure gradually reduces the thickness of the green compact. Past a given time point the compact thickness becomes constant and no more reduction of thickness takes place. In this state the application of the press pressure usually is discontinued. To achieve higher density it is effective to apply a preload to the compact at the time of pressing and hold it for some time, say 30 minutes or more, after the above time point. For the purposes of the invention this procedure is called "holding". In this way a high-density sintered body having a density of 99% or more is obtained.

Pressing a compact of fine synthesized metal silicide powder at elevated temperature for a sufficient period of time allows intergranular sintering to proceed until a uniform sintered structure results. The hot pressing in this case must be solid-phase sintering. Many methods of the prior art produce a liquid phase during the time period of sintering, which has been known to be prone to particle generation. It is for this reason that the present invention adopts solid-phase sintering under the specified conditions.

After the pressing, the pressed product is taken out from the die and is finished by machining it to a sputtering target with specified shape and dimension. Finally the target produced is subjected to a deformed layer-removal step that is preferably incorporated under the present invention whereby the deformed layer is partly removed from the target and the surface is smoothened. The process of deformed layer removal is performed by ion milling, sputtering, electropolishing, chemical etching, lapping, polishing, or other suitable technique for surface treatment. These techniques are all effective as deformed layer-removal steps by which a target surface layer from 20 to 100 μm thick is removed strain-free. Such a surface treatment decreases the surface roughness ($R_a$) from the pretreatment value of about 5.0 μm to 1.0 μm or less. The step is followed by ultrasonic cleaning with isopropyl alcohol or the like and vacuum drying to provide a product completely freed from the contaminants that had deposited on the surface during the surface treatment. Lastly, the target thus obtained is bonded to a backing plate.

The deformed layer-removal step, along with the limitation of the area ratio of silicon phases appearing on the sputter surface to 23% or less, has been found very effective for controlling the early-stage particle generation. In the case of a metal silicide target, a considerable amount of particles are generated at the early stage of sputtering and the particles deposit, e.g., on the inner walls of equipment, build up, and come off onto the film. Controlling the early-stage particle generation, therefore, reduces substantially the total number of particles that deposit on a wafer.

Thus a metal silicide target having a density of at least 99% is obtained which contains no more than one coarse silicon phase 10 μm or larger in size that appears on the sputter surface per square millimeter. The oxygen content of the target is no more than 150 ppm.

Desirably, as stated above, the area ratio of silicon phases that appear on the sputter surface is restricted to 23% or less, and the deformed layer on the surface is removed to attain a surface roughness of from more than 0.05 μm to 1 μm. Thus, the use of a finely ground metal silicide powder reduces the number of coarse silicon phase that appears on the sputter surface to one or fewer per square millimeter and attains a target density of 99% or more to decrease the voids. The overall control of the probability of free silicon generation is effected through the restriction of the area ratio of the silicon phases that appear on the sputter surface. These restrictions are combined with the removal of the deformed layer from the surface and restricting the surface roughness to the range from more than 0.05 μm to 1 μm to reduce the amount of particle generation substantially from the ordinary level.

The area ratio of silicon phases that appear on the sputter surface and the number of coarse silicon phases 10 μm or larger in diameter that occur were measured and counted visually under a microscope with a magnification of 100×.

EXAMPLES

The invention is illustrated by the following examples and comparative examples.

Example 1

A molybdenum silicide powder (Si/Mo molar ratio=2.30), prepared by fine grinding on a counter jet mill to the maximum particle diameter of 10 μm and an oxygen concentration of 1200 ppm, was charged into a hot press die and kept there under vacuum at 1300° C. for 4 hours. The charge was then hot pressed at 1300° C. A molybdenum silicide target having a density ratio of more than 99.99% and an oxygen concentration of 50 ppm was obtained. Its Si/Mo molar ratio decreased by 0.02. The largest Si phase that appeared on the sputter surface measured 10 μm in diameter and numbered only one per square millimeter. A molybdenum silicide film was formed by sputtering from this target, and the particles on a wafer were determined by the laser method. Particles 0.3 μm or larger in size found on a 6-in wafer numbered 10.

Example 2

The same molybdenum silicide powder as used in Example 1 was formed by cold pressing into a briquet with a density ratio of 60%. The briquet was heated under vacuum at 1300° C. for 4 hours. The briquet now had a density of 88% an oxygen concentration of 130 ppm. It was then hot pressed to obtain a target with a density of more than 99.99% and an oxygen concentration of 130 ppm. The Si/Mo molar ratio decreased by 0.02. The largest Si Phase that appeared on the sputter surface measured 10 μm in diameter and numbered again only one per square millimeter. A molybdenum silicide film was formed by sputtering from this target, and the particles on a wafer were determined by the laser method. Particles 0.3 μm or larger in size found on a 6-in. wafer numbered 10.

Example 3

A tungsten silicide powder, prepared by fine grinding on a counter jet mill to the maximum particle diameter of 8 μm and an oxygen concentration of 1500 ppm, was held in a die under vacuum at 1300° C. for 10 hours, and then hot pressed at 1300° C. A tungsten silicide target having a density ratio of more than 99.99% and an oxygen concentration of 30 ppm was obtained. Its Si/W molar ratio decreased by 0.03. The largest Si phase that appeared on the sputter surface measured 8 μm in diameter and there was no Si phase 10 μm or larger. A tungsten silicide film was formed by sputtering from this target, and the particles on a wafer were determined by the laser method. Particles 0.3 μm or larger in size found on a 6-in. wafer numbered 8.

Comparative Example 1

The molybdenum silicide powder of Examples 1 and 2 was used and hot pressed in the usual manner, with a load applied from the beginning. A target having a density ratio of more than 99.99% and an oxygen concentration of 1000 ppm was obtained. There occurred no decrease in the molar ratio. The number of the Si phase 10 μm or larger in size that appeared on the sputter surface was one per square millimeter.

ADVANTAGES OF THE INVENTION

The problems of particle generation and contamination with oxygen associated with the use of metal silicide targets have been tackled and solved successfully for the first time in the art. A metal silicide target for sputtering having a density of at least 99% having, no more than one coarse silicon phase 10 μm or larger in size that appears, per square millimeter, on the sputter surface, and having an oxygen content of at most 150 ppm can now be manufactured by controlling the amount of coarse silicon phases 10 μm or larger in size that appear on the sputter surface and by improving the sintering process. In addition, the amount of free particle generation can further be reduced by slightly decreasing the silicon/metal molar ratio, lowering the area ratio of silicon phases that appear on the sputter surface, and partially removing the deformed layer from the surface. The invention thus contributes to the practical application of metal silicides that have much promising future as films for more complex LSIs with lower resistivities and narrower line widths and spaces than before, to the semiconductor devices of tomorrow, e.g., higher integration-scale (4, 16, and 64-megabit) LSIs and VLSIs.

What is claimed is:

1. A metal silicide target for sputtering which has a density of at least 99%, no more than one coarse silicon phase 10 μm or larger in size that appears, per square millimeter, on the sputter surface of the target, an area ratio of silicon phases that appear on the sputter surface of 23% or less, a surface roughness ranging from more than 0.05 μm to 1 μm attained by at least partly removing a deformed layer on the target surface, and an oxygen content of at most 150 ppm.

2. A metal silicide target for sputtering which has a density of at least 99%, has no more than one coarse silicon phase 10 μm or larger in size that appears, per square millimeter, on the sputter surface of the target, has an area ratio of silicon phases that appear on the sputter surface of 23% or less, has a surface roughness ranging from more than 0.05 μm to 1 μm, and has an oxygen content of at most 150 ppm, manufactured by a process which comprises:

preparing a synthesized metal silicide powder, wherein the synthesized metal silicide powder has coarse particles 20 μm or larger in size, further finely grinding the synthesized metal silicide powder so that coarse particles 20 μm or larger in size are eliminated, vacuum annealing the further finely ground metal silicide powder in a hot press die without the application of pressure to remove at least a part of the oxygen in the form of $SiO_2$, compacting and sintering the annealed metal silicide powder to a density of at least 99% by a hot press, and at least partly removing a deformed layer on the target surface to attain a surface roughness ranging from more than 0.05 μm to 1 μm.

3. A metal silicide target for sputtering which has a density of at least 99%, has no more than one coarse silicon phase 10 μm or larger in size that appears, per square millimeter, on the sputter surface of the target, has an area ratio of silicon phases that appear on the sputter surface of 23% or less, has a surface roughness ranging from more than 0.05 μm to 1 μm, and has an oxygen content of at most 150 ppm, manufactured by a process which comprises:

preparing a synthesized metal silicide powder, wherein the synthesized metal silicide powder has coarse particles 20 μm or larger in size, further finely grinding the synthesized metal silicide powder so that coarse particles 20 μm or larger in size are eliminated, preparing a presintered body at a density ratio of 50 to 75% of the further ground metal silicide powder, vacuum annealing the further presintered body to remove at least a part of the oxygen in the form of $SiO_2$, compacting and sintering the annealed presintered body to a density of at least 99% by a hot press, and at least partly removing a deformed layer on the target surface to attain a surface roughness ranging from more than 0.05 μm to 1 μm.

* * * * *